(12) United States Patent
Frohberg et al.

(10) Patent No.: US 8,536,050 B2
(45) Date of Patent: Sep. 17, 2013

(54) SELECTIVE SHRINKAGE OF CONTACT ELEMENTS IN A SEMICONDUCTOR DEVICE

(75) Inventors: Kai Frohberg, Niederau (DE); Ralf Richter, Dresden (DE); Torsten Huisinga, Dresden (DE); Katrin Reiche, Goltzscha (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 143 days.

(21) Appl. No.: 13/102,411

(22) Filed: May 6, 2011

(65) Prior Publication Data
US 2011/0291292 A1 Dec. 1, 2011

(30) Foreign Application Priority Data
May 31, 2010 (DE) .......................... 10 2010 029 533

(51) Int. Cl.
*H01L 21/4763* (2006.01)
(52) U.S. Cl.
USPC ........... 438/637; 438/643; 438/672; 438/694; 438/702; 438/723; 257/E21.011
(58) Field of Classification Search
None
See application file for complete search history.

(56) References Cited

U.S. PATENT DOCUMENTS

| 5,084,416 A | 1/1992 | Ozaki et al. ................... 437/190 |
| 6,008,123 A | 12/1999 | Kook et al. ................... 438/639 |
| 6,091,154 A | 7/2000 | Ohkawa ........................ 257/774 |
| 6,200,849 B1 | 3/2001 | Kim ................................. 438/241 |
| 6,660,456 B2 | 12/2003 | Wiltshire ....................... 430/314 |
| 2006/0073698 A1* | 4/2006 | Chen et al. .................... 438/637 |
| 2008/0272406 A1* | 11/2008 | Banna ........................... 257/270 |

FOREIGN PATENT DOCUMENTS

JP 04216665 A 8/1992

OTHER PUBLICATIONS

Translation of Official Communication from German Patent Office for German Patent Application No. 10 2010 029 533.7-33 dated Dec. 8, 2010.

* cited by examiner

*Primary Examiner* — Kyoung Lee
(74) *Attorney, Agent, or Firm* — Williams, Morgan & Amerson, P.C.

(57) ABSTRACT

In sophisticated semiconductor devices, the contact elements connecting to active semiconductor regions having formed thereabove closely spaced gate electrode structures may be provided on the basis of a liner material so as to reduce the lateral width of the contact opening, while, on the other hand, non-critical contact elements may be formed on the basis of non-reduced lateral dimensions. To this end, at least a first portion of the critical contact element is formed and provided with a liner material prior to forming the non-critical contact element.

18 Claims, 6 Drawing Sheets

SELECTIVE SHRINKAGE OF CONTACT ELEMENTS IN A SEMICONDUCTOR DEVICE

BACKGROUND OF THE INVENTION

1. Field of the Invention

The present disclosure generally relates to the field of semiconductor manufacturing, and, more particularly, to the formation of contact elements directly connecting to a circuit element.

2. Description of the Related Art

Semiconductor devices, such as advanced integrated circuits, typically contain a great number of circuit elements, such as transistors, capacitors, resistors and the like, which are usually formed in a substantially planar configuration on an appropriate substrate having formed thereon a semiconductor layer. Due to the high number of circuit elements and the required complex layout of modern integrated circuits, the electrical connections of the individual circuit elements may generally not be established within the same level on which the circuit elements are manufactured, but require a plurality of additional "wiring" layers, which are also referred to as metallization layers. These metallization layers generally include metal-containing lines, providing the inner-level electrical connection, and also include a plurality of inter-level connections, which are also referred to as "vias," that are filled with an appropriate metal and provide the electrical connection between two neighboring stacked metallization layers.

Due to the continuous reduction of the feature sizes of circuit elements in modern integrated circuits, the number of circuit elements for a given chip area, that is, the packing density, also increases, thereby necessitating an adequate number of electrical connections to provide the desired circuit functionality. Therefore, the number of stacked metallization layers usually increases as the number of circuit elements per chip area becomes larger, while nevertheless the sizes of individual metal lines and vias are reduced.

Similarly, the contact structure of the semiconductor device, which may be considered as an interface connecting the circuit elements of the device level with the metallization system, has to be adapted to the reduced feature sizes in the device level and the metallization system. For this reason, very sophisticated patterning strategies may have to be applied in order to provide the contact elements with the required density and with appropriate reduced dimensions, at least at the device level side, in order to appropriately connect to the contact regions, such as drain and source regions, gate electrode structures and the like, without contributing to pronounced leakage current paths and even short circuits and the like. In many conventional approaches, the contact elements or contact plugs are typically formed by using a tungsten-based metal together with an interlayer dielectric stack that is typically comprised of silicon dioxide in combination with an etch stop material, such as a silicon nitride material. Due to the very reduced critical dimensions of the circuit elements, such as the transistors, the respective contact elements have to be formed on the basis of contact openings with an aspect ratio which may be as high as approximately 8:1 or more, wherein a diameter of the contact openings may be 0.1 μm or significantly less for transistor devices of, for instance, the 65 nm technology node. In even further sophisticated approaches, and in very densely packed device regions, the width of the contact openings may be 50 nm and less. Generally, an aspect ratio of such contact openings may be defined as the ratio of the depth of the opening relative to the width of the opening.

Hence, after providing the contact opening with the required minimum width, an appropriate conductive material, such as tungsten in combination with an appropriate barrier layer system, has to be deposited, which may typically be accomplished on the basis of sputter deposition technique, for instance, for the barrier materials and chemical vapor deposition (CVD)-like process recipes for forming the tungsten material.

Upon further reducing the critical dimensions of transistor elements, the complexity of the patterning process, i.e., of the lithography process and the subsequent etch process, may result in severe contact failures when densely packed device regions are considered. For example, in densely packed device regions, transistors, and thus gate electrode structures, have to be positioned close to each other in view of the corresponding design requirements, wherein drain and source regions may have to be contacted between the closely spaced gate electrode structures. Consequently, the patterning process has to provide contact openings with a lateral width that is less than the spacing between closely spaced gate electrode structures, while at the same time a high degree of accuracy in appropriately aligning the corresponding etch mask may result in extremely reduced process margins. Thus, even minute misalignments of the lateral position of an etch mask with respect to the gate electrode structures may result in an exposure of gate electrode material during the subsequent complex etch process, which will finally result in a short circuit between the contact element and the adjacent gate electrode structure.

Consequently, in view of enhancing the reliability of the manufacturing process and the resulting contact elements of semiconductor devices, in particular in view of contacts that have to connect to the active semiconductor region in areas comprising closely spaced gate electrode structures, the final width of contact openings may be defined on the basis of an additional deposition process in which a liner material, such as a silicon dioxide material, may be formed in the contact opening, for instance prior to etching through an etch stop layer, thereby reliably covering any exposed portions of gate electrode structures and also providing an efficient etch mask of reduced width for etching through the contact etch stop layer in order to reliably connect to the contact region in the active semiconductor region. Hence, the resolution of well-established lithography techniques and patterning strategies may be refined by forming the silicon dioxide liner material in the contact openings prior to performing a final etch step, thereby reducing the probability of creating short circuits between contact elements and adjacent gate electrode structures. On the other hand, the overall contact resistivity may be increased due to the reduced cross-sectional area of the contact elements, which may particularly negatively affect contact elements which are positioned in less critical device regions. For example, contact elements connecting to the contact areas of gate electrode structures may be less critical with respect to misalignments and short circuits which, however, may suffer from a significantly increased contact resistivity, thereby contributing to an overall reduced performance of a contact level of the semiconductor device.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which contact elements may be formed with a reduced probability of creating short circuits in critical device areas, for instance active semiconductor regions having formed thereon closely spaced gate electrode structures by forming a liner material in the contact opening, while, on the other hand, in other contact openings formed in a less critical neighborhood, a reduction in width by the liner material may be avoided. To this end, in some illustrative embodiments disclosed herein, the critical contact openings may be formed first and may receive the liner material for defining the final width of the critical contact openings and also covering critical sidewall areas, whereas less critical contact openings, such as contact openings connecting to gate electrode structures, may be formed in a subsequent patterning sequence. Thereafter, the final depth of the contact openings may be obtained in a common etch process, wherein the liner material in the critical contact openings may provide a desired reduced width in the critical contact areas. The separate patterning processes for forming at least a significant portion of the contact openings in a subsequent manner may be accomplished by applying dedicated lithography processes, while, in other illustrative aspects disclosed herein, a hard mask approach based on a single lithography process may be applied.

One illustrative method disclosed herein relates to a method of forming contact elements of a semiconductor device. The method comprises forming a first contact opening in an interlayer dielectric material and forming a liner on sidewalls of the first contact opening so as to reduce a width of the first contact opening. The method further comprises forming a second contact opening in the interlayer dielectric material after forming the liner. Furthermore, the method comprises increasing a depth of the first and second contact openings so as to connect to a first contact region and a second contact region, respectively. Additionally, the method comprises filling the first and second contact openings with a conductive material so as to form a first contact element connecting to the first contact region and to form a second contact element connecting to the second contact region.

A further illustrative method disclosed herein relates to forming contact elements of a semiconductor device. The method comprises forming a first contact opening in a dielectric material of a contact level of the semiconductor device. Furthermore, a second contact opening is formed in the dielectric material. The method additionally comprises forming a liner selectively in the first contact opening so as to reduce a width thereof. Additionally, the method comprises filling the first and second contact openings with a conductive material.

One illustrative semiconductor device disclosed herein comprises a first contact region formed in a semiconductor region of a semiconductor layer. The semiconductor device further comprises a second contact region formed in a gate electrode structure that is formed above the semiconductor layer. Additionally, an interlayer dielectric material is formed above the semiconductor layer and the gate electrode structure. The device further comprises a first contact element formed in the interlayer dielectric material so as to connect to the first contact region, wherein a portion of the first contact element is laterally delimited by a liner material. Furthermore, the semiconductor device comprises a second contact element formed in the interlayer dielectric material so as to connect to the first contact region, wherein the second contact element is in direct contact with the interlayer dielectric material.

BRIEF DESCRIPTION OF THE DRAWINGS

The disclosure may be understood by reference to the following description taken in conjunction with the accompanying drawings, in which like reference numerals identify like elements, and in which.

Figure 1A:
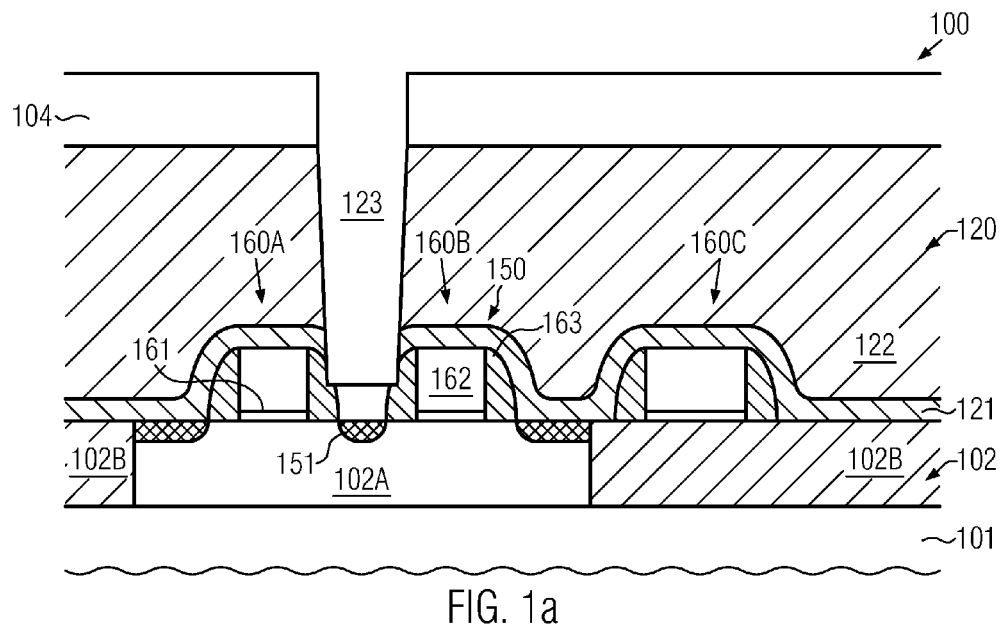
FIGS. 1a-1d schematically illustrate cross-sectional views of a semiconductor device during various manufacturing stages in forming contact elements by applying lithography and patterning processes for contact elements connecting to the active semiconductor region and to gate electrode structures in order to individually adjust the width of critical contact openings on the basis of a liner material, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which the probability of creating contact failures in critical device areas may be reduced by selectively forming a liner material after forming the first portion of the critical contact opening, while the first portion of a non-critical contact opening, such as a contact opening connecting to a gate electrode structure, may be formed in a separate etch process after the deposition of the liner material. For this purpose, dedicated lithography processes may be applied to sequentially form the contact openings, i.e., corresponding first portions thereof, while, in other illustrative embodiments disclosed herein, the number of lithography steps may be reduced by applying an appropriately configured hard mask in combination with appropriate deposition techniques.

FIG. 1a schematically illustrates a cross-sectional view of a semiconductor device 100 in an advanced manufacturing stage. As shown, the device 100 may comprise a substrate 101, such as a semiconductor substrate, an insulating substrate and the like. Furthermore, a semiconductor layer 102 may be formed above the substrate 101 and may comprise any appropriate semiconductor materials in an initial state, while, in any further advanced manufacturing stage, for instance as shown in FIG. 1a, the semiconductor layer 102 may also comprise dielectric materials, for instance in the form of shallow trench isolations and the like, as indicated by 102B. The isolation structure 102B may thus laterally delineate appropriate semiconductor regions or active regions within the "semiconductor layer" 102, wherein, for convenience, a semiconductor region 102A is illustrated, which may represent any semiconductor region for forming therein and thereabove circuit elements 150, such as field effect transistors and the like. It should be appreciated that the semiconductor layer 102 and the substrate 101 may form an SOI (silicon-on-insulator) configuration when a buried insulating material (not shown) is provided directly below the semiconductor layer 102. In other cases, the semiconductor layer 102 may be an upper portion of a crystalline material of the substrate 101, wherein the isolation structure 102B may extend down to a desired depth into the crystalline semiconductor material so as to laterally delineate the semiconductor region 102A.

The circuit elements 150 may be provided on the basis of critical dimensions of 50 nm and less when, for instance, sophisticated logic circuit portions are considered, in which field effect transistors represent the dominant circuit element. As shown, the circuit elements 150 may comprise gate electrode structures 160A, 160B, 160C, which may extend above semiconductor regions and isolation structures, depending on the overall device requirements. In the embodiment shown, the gate electrode structures 160A, 160B may be formed above the semiconductor region 102A, while the gate electrode structure 160C may be positioned above the isolation structure 102B. It should be appreciated that gate electrode structures 160A, 160B and 160C may extend in a width direction, i.e., a direction perpendicular to the drawing plane of FIG. 1a, in accordance with device requirements so that typically the gate electrode structures 160A, 160B may extend across an isolation structure, while similarly the gate electrode structure 160C may be formed above a semiconductor region. That is, the portion of the gate electrode structure 160C formed above the isolation structure 102B may represent a contact area of the gate electrode structure 160C wherein, if considered appropriate, even an increased gate length may be provided for this portion of the gate electrode structure 160C. On the other hand, the portions of the gate electrode structures 160A, 160B positioned above the semiconductor region 102A may typically be provided with the minimum critical dimensions in order to provide superior packing density above the semiconductor region 102A. Furthermore, the gate electrode structures 160A, 160B and 160C may have any appropriate configuration, for instance appropriate gate dielectric materials 161 and electrode material 162 may be provided, for instance comprising any appropriate dielectric materials, such as silicon oxide-based materials, high-k dielectric materials, which are to be understood as dielectric materials having a dielectric constant of 10.0 or higher, and the like, while the gate electrode materials 162 may represent well-established materials, such as polysilicon, silicon/germanium and the like, possibly in combination with any metal-containing components, such as a metal silicide and the like. Furthermore, the gate electrode structures 160A, 160B, 160C may comprise any appropriate spacer structure 163 in accordance with the overall process and device requirements.

Typically, the circuit elements 150 may comprise appropriate contact areas within the semiconductor region 102A, for instance in the form of drain and source regions (not shown) and the like, wherein, frequently, superior contact resistivity may be obtained by increasing, at least locally, the overall conductivity of the material in the semiconductor region 102A. For example, metal silicide materials, such as nickel silicide and the like, may be provided within the active region 102A so as to act as a contact region.

Moreover, in the manufacturing stage shown, the device 100 may comprise an interlayer dielectric material 120 which, in combination with any contact elements to be formed therein, may represent the contact level of the semiconductor device 100, i.e., the interface connecting the circuit elements 150 with a metallization system (not shown) to be formed above the interlayer dielectric material 120. In the embodiment shown, the interlayer dielectric material 120 may comprise a first dielectric layer 121, such as silicon nitride material, which may also act as an efficient etch stop material for patterning a second dielectric layer 122, which is typically provided in the form of a silicon dioxide material. It should be appreciated, however, that the interlayer dielectric material 120 may comprise any further dielectric material layers, depending on the overall requirements of the device 100. For example, the interlayer dielectric material 120 may comprise highly stressed dielectric material layers in order to enhance performance of at least some of the circuit elements 150. Furthermore, an etch mask 104, such as a resist material and/or a hard mask material, may be provided above the interlayer dielectric material 120 and may have any appropriate configuration so as to define the lateral size and shape of a contact opening 123 that is formed in the interlayer dielectric material 120 so as to connect to a certain depth, however, without exposing the contact region 151. It should be appreciated that the contact opening 123 may also be considered as a first portion of a contact opening that may finally extend down to the contact region 151, as will be described later on in more detail. Moreover, as previously discussed, the width or generally the lateral dimensions of the opening 123 may be critical in the sense that any process non-uniformity or misalignment may result in an exposure of a portion of the electrode materials 162 of any of the gate electrode structures 160A, 160B, which may result in a fatal contact failure, as is also previously explained. Consequently, the lateral dimensions of the opening 123 have to be reduced during the further processing in order to cover any possibly exposed portions of the gate electrode materials 162 and also to provide a reduced width upon increasing the depth of the opening 123, or upon forming a second portion of the opening 123 in a further etch process.

The semiconductor device 100 as illustrated in FIG. 1*a* may be formed on the basis of the following processes. The isolation structure 102B may be provided within the semiconductor layer 102 on the basis of well-established lithography, etch, deposition and planarization techniques, thereby laterally delineating respective semiconductor "islands" in the semiconductor layer 102. Prior to or after forming the isolation structure 102B, the basic dopant concentration in the semiconductor region 102A may be established, for instance by ion implantation and the like. Thereafter, the gate electrode structures 160A, 160B, 160C may be formed by providing appropriate materials for the gate insulation layers 161 and the electrode materials 162. To this end, any appropriate process strategy may be applied, wherein any specifics thereof may significantly depend on the desired configuration of the gate electrode structures 160A, 160B, 160C. After providing an appropriate gate layer stack, sophisticated lithography and patterning strategies may be applied in order to form the gate electrode structures 160A, 160B, 160C with the desired lateral dimensions and thus with a desired gate length, i.e., in FIG. 1*a*, the horizontal extension of the gate electrode materials 162. As previously discussed, in sophisticated applications, a gate length of 50 nm and less may be used. Similarly, the lateral spacing between the adjacent gate electrode structures 160A, 160B may be defined during the patterning process and may be 100 nm and significantly less in densely packed device regions, such as the semiconductor region 102A. Thereafter, further process steps may be performed, such as providing appropriate dopant species for forming drain and source regions (not shown), with any intermediate deposition and patterning processes for forming the spacer structure 163. After any anneal processes, the contact areas 151 may receive any appropriate metal species, if required, for instance in the form of a metal silicide, which may be accomplished by using well-established silicidation techniques. Next, the interlayer dielectric material 120 may be provided, for instance by first depositing one or more material layers, such as the layer 121, which may be accomplished by well-established plasma enhanced chemical vapor deposition (CVD) processes. It should be appreciated that any appropriate process sequence may be applied, for instance, for forming highly stressed dielectric materials having different types of internal stress, if required. Thereafter, the dielectric material 122 may be formed, for instance, by plasma enhanced CVD, sub-atmospheric CVD and the like. If required, an additional planarization process may be applied in order to reduce any surface topography, thereby establishing superior conditions for the subsequent lithography process for forming the etch mask 104. To this end, any additional materials, such as anti-reflective coating (ARC) materials, hard mask materials and the like, may be supplied in combination with the resist material, which may then be patterned on the basis of a lithography process using a lithography mask, which may thus define the lateral size and position of the contact opening 123. Thus, based on the etch mask 104, which may be provided as a single resist mask, while in other cases additional hard mask materials (not shown) and the like may be used, an etch process may be performed by using well-established recipes in order to remove silicon dioxide material selectively with respect to silicon nitride so that the dielectric layer 121 and also the spacer structure 163 may be used as efficient etch stop materials.

Figure 1B:
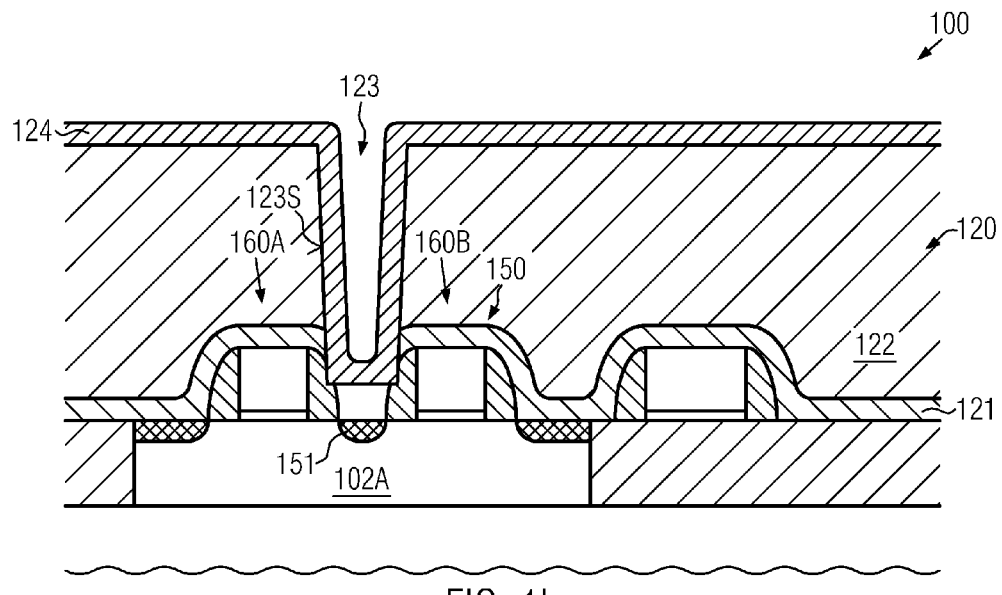

FIG. 1*b* schematically illustrates the semiconductor device 100 in a further advanced manufacturing stage. As illustrated, after the removal of the etch mask 104 (FIG. 1*a*), a liner material 124 may be formed above the dielectric material 122 and within the contact opening 123. Consequently, the liner material 124 may be formed on sidewall areas 123S of the contact opening 123, thereby reducing the effective lateral dimension of the contact opening 123. The liner material 124 may be comprised of any appropriate material, such as silicon dioxide, which may be provided with a highly conformal deposition technique, such as CVD and the like. Consequently, by providing the liner 124 within the opening 123, any possibly exposed portions of the gate electrode structures 160A, 160B may be covered, while at the same time the width of the opening 123 may be reduced and may be appropriately positioned above the contact region 151, even if a certain misalignment may have occurred, as long as the corresponding misalignment is less than a thickness of the liner 124 within the contact opening 123.

Figure 1C:
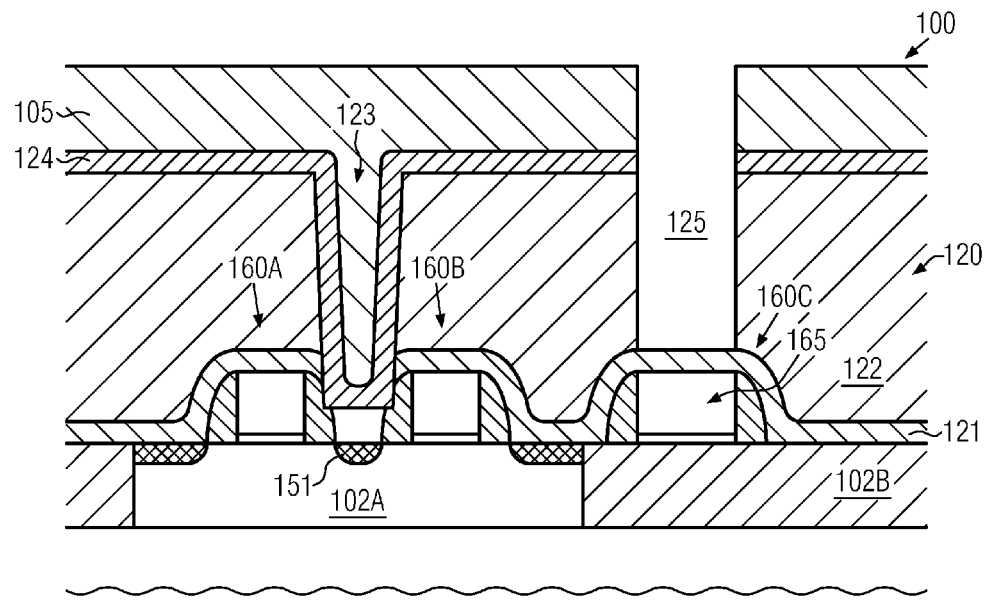

FIG. 1*c* schematically illustrates the semiconductor device 100 in a further advanced manufacturing stage in which a further etch mask 105 may be formed above the interlayer dielectric material 120 and above the liner material 124. Furthermore, a second contact opening 125 may be formed in the liner material 124 and dielectric material 122 and may extend to or into the etch stop material 121. It should be appreciated that the contact opening 125 may also be considered as a first portion of a contact element that may finally connect to the gate electrode structure 160C, i.e., to a corresponding contact region 165, which may be provided in the form of a metal silicide material and the like. The contact opening 125 may have any appropriate lateral size so as to appropriately connect to the gate electrode structure 160C, wherein any further reduction of the lateral size may be considered disadvantageous, for instance in terms of overall contact resistivity, as is also previously explained.

The contact opening 125 may be formed on the basis of any appropriate process strategy in which the etch mask 105 may be provided on the basis of a lithography process followed by an anisotropic etch process, which may be performed on the basis of similar process recipes as may also be used for forming the contact opening 123. Consequently, the etch process may be efficiently stopped on and in the dielectric material 121. Next, the etch mask 105 may be removed, for instance by performing a plasma assisted strip process and the like, thereby exposing the liner material 124 above the dielectric material 122 and within the contact opening 123. Next, a further etch process sequence may be applied in which the liner material 124 within the contact opening 123 may be removed at a bottom thereof, which may be accomplished on the basis of anisotropic etch processes for removing silicon dioxide material, wherein any such recipes may have also been applied during patterning of the dielectric material 122 for forming the contact openings 123 and 125. During this etch process, the contact opening 123 of reduced lateral dimension may act as an etch mask so that the dielectric material 121 below the contact opening 123 may be exposed with a reduced lateral dimension compared to the initial lateral size of the contact opening 123 (FIG. 1*a*). Upon exposing the dielectric material 121 in the contact opening 123, the further processing may be continued by using an appropriate etch chemistry for etching through the dielectric material 121, for which a plurality of well-established recipes are available.

Figure 1D:
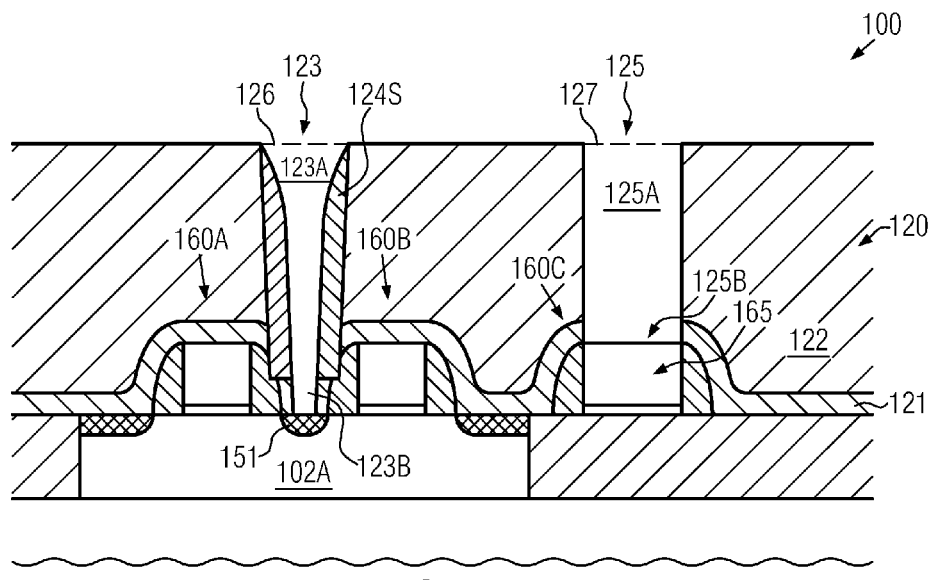

FIG. 1*d* schematically illustrates the device 100 in a further advanced manufacturing stage. As illustrated, the depth of the contact openings 123 and 125 have been increased so as to extend to the contact region 151 and to the gate electrode structure 160C, respectively. In other words, the contact opening 123 may be considered as comprising a first part 123A, which may extend to and into the dielectric material 121, while a second part 123*b* may extend through the dielectric material 121 so as to connect to the contact region 151. Similarly, the contact opening 125 may be considered as being comprised of a first part 125A, which may extend to and to a certain degree into the dielectric material 121 (see FIG. 1*c*), while a second part 125B may extend through the dielectric material 121 so as to connect to the gate electrode structure 160C, i.e., to the contact region 165 provided therein. As explained above with reference to FIG. 1*c*, the contact openings 123, 125 may be completed on the basis of any well-established etch recipe, wherein also any excess material of the liner 124 (FIG. 1*c*) may be removed, thereby forming inner sidewall spacers 124S, which may thus laterally delineate any appropriate conductive material, such as tungsten, aluminum, copper and the like, possibly in combination with any appropriate conductive barrier material or materials of a contact element 126 from the dielectric material 122, while, on the other hand, in the contact opening 125, a corresponding contact metal or metals of a contact element 127 may be directly in contact with the interlayer dielectric material 120. The contact elements 126, 127, indicated by dashed lines, may be formed on the basis of any appropriate deposition technique, for instance using any well-established CVD process strategies, in combination with providing any conductive barrier materials, as is also previously discussed. It should be appreciated, however, that any other contact metal in combination with appropriate barrier materials may be applied. Due to the presence of the inner sidewall spacer 124S, the contact opening 123 as a whole and in particular the second part 123B thereof may be appropriately positioned and aligned to the contact region 151, while also the probability of providing a short circuit between the contact element 126 and any of the adjacent gate electrode structures 160A, 160B may be reduced. On the other side, the contact element 127 may have superior contact resistivity since any undue restriction of the cross-sectional area of the contact element 127 has been avoided. Thus, upon filling in any appropriate barrier materials and contact metals, any excess material may be removed, for instance by chemical mechanical polishing (CMP) and the like, thereby providing the contact elements 126 and 127 as electrically isolated elements. Thereafter, the processing may be continued by forming a metallization system in accordance with any appropriate manufacturing strategy.

Figure 1E:
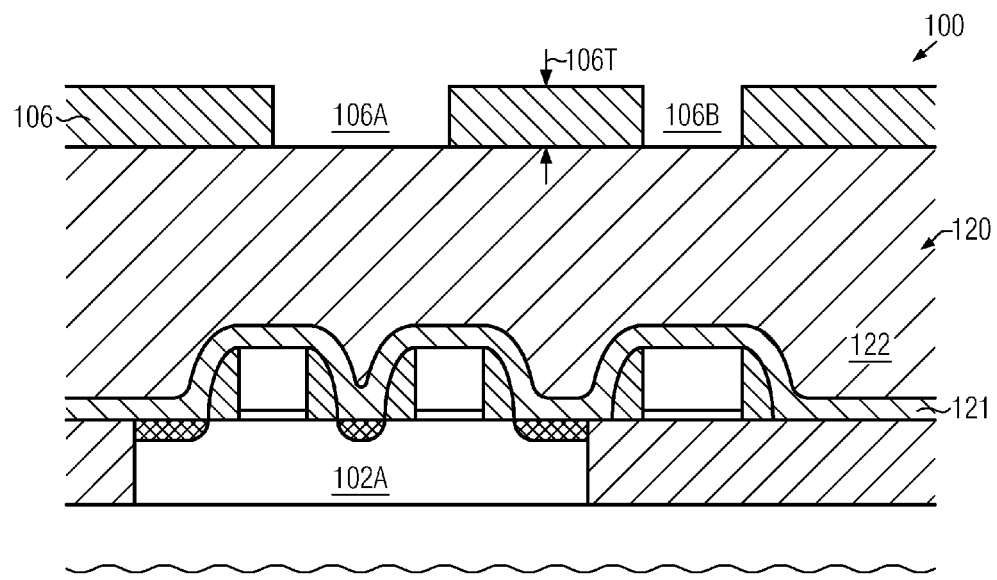
FIGS. 1e-1l schematically illustrate cross-sectional views of the semiconductor device during various manufacturing stages in which a liner material may be provided selectively in critical contact openings with a reduced number of lithography steps, according to further illustrative embodiments.

FIG. 1*e* schematically illustrates the semiconductor device 100 according to further illustrative embodiments in which a hard mask 106 may be formed above the interlayer dielectric material 120 and may comprise mask openings 106A, 106B which may be used for forming contact openings in the interlayer dielectric material 120. In the embodiment shown, the mask opening 106B may have appropriate lateral dimensions so as to define the desired size in terms of superior contact resistivity, while the mask opening 106A may have greater lateral dimensions, at least along a length direction, i.e., in FIG. 1*e*, the horizontal direction. Furthermore, the hard mask 106 may have a thickness 106T that may be appropriate for forming a spacer material in a conformal manner within the mask opening 106A in order to appropriately reduce the lateral dimension thereof, while the mask opening 106B, having reduced lateral dimensions, may be reliably filled by a corresponding spacer material. For example, the thickness 106T may be selected in the range of approximately 30-100 nm, wherein it should be appreciated that any other thickness value may be selected as long as the desired deposition behavior may be achieved. Moreover, the hard mask 106 may be comprised of any appropriate material or materials, such as silicon nitride, silicon oxynitride and the like. The hard mask 106 may be formed on the basis of well-established deposition techniques, followed by a lithography process in which the mask openings 106A, 106B may be commonly transferred into the mask layer of the mask 106 by means of any appropriate resist mask. Consequently, the openings 106A, 106B may be provided by a single lithography process.

Figure 1F:
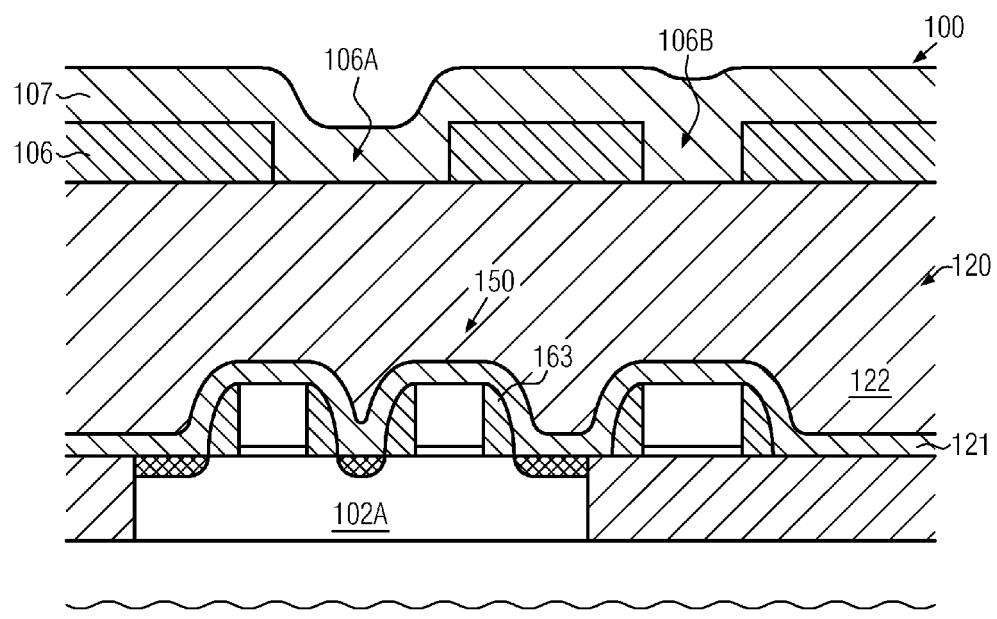

FIG. 1*f* schematically illustrates the semiconductor device 100 with a spacer layer 107 formed above the hard mask 106, wherein a thickness of the layer 107 may be selected such that an appropriate reduction in lateral size of the mask opening 106A may be achieved upon forming spacer elements therein, while, on the other hand, the mask opening 106B having the reduced lateral dimension may be substantially completely filled with material of the layer 107. For example, the spacer layer 107 may be provided with a thickness of approximately 30-100 nm, depending on the initial length of the mask opening 106A. The spacer layer 107 may be provided in the form of any appropriate material, such as amorphous carbon, silicon nitride, silicon dioxide and the like. In one illustrative embodiment, the spacer layer 107 may be provided as a material that is also used for providing the mask 106. Consequently, the material of the layers 107 and 106 may have a desired high etch resistivity when performing an etch process for patterning the dielectric layer 122 of the interlayer dielectric material 120. The spacer layer 107 may be provided on the basis of any well-established deposition technique, wherein, for instance, for silicon nitride, a plurality of deposition recipes are available, for instance as are also typically applied upon forming spacer elements, such as the sidewall spacer structure 163 of the circuit elements 150.

Figure 1G:
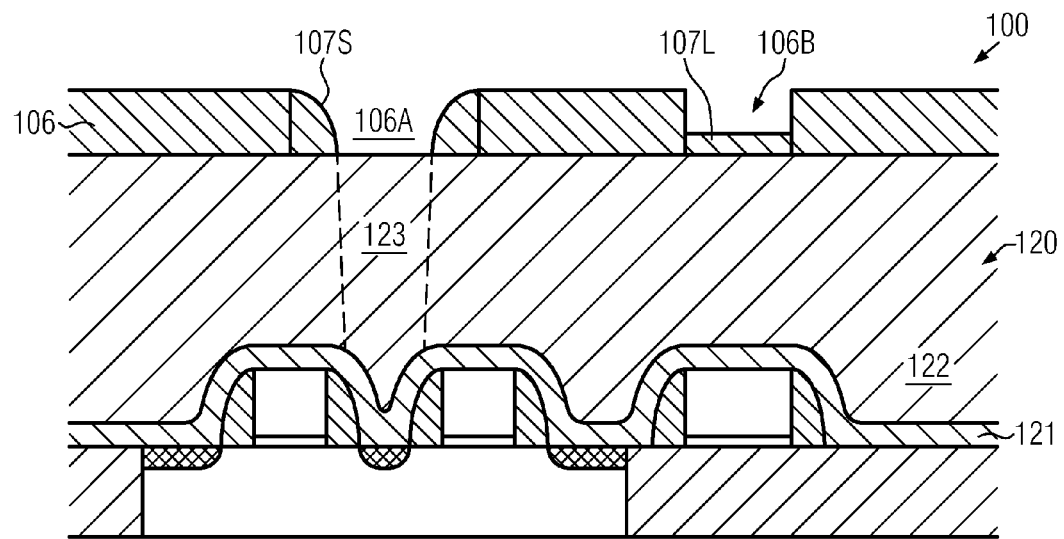

FIG. 1*g* schematically illustrates the device 100 in a further advanced manufacturing stage in which a spacer element 107S may be formed within the mask opening 106A, thereby reducing the lateral dimensions thereof. On the other hand, a remaining portion of the spacer layer 107 (FIG. 1*f*, indicated by 107L, may still be present in the mask opening 106B, thereby acting as an efficient etch stop layer during an etch process for forming the contact opening 123 in the dielectric material 122 of the interlayer dielectric material 120. The spacer 107S may be formed on the basis of well-established anisotropic etch techniques, wherein, due to the increased layer thickness in the mask opening 106B, the corresponding material may not be completely removed, thereby providing the mask layer 107L within the opening 106B. Thereafter, an anisotropic etch process may be applied in which the mask layer 106 in combination with the spacer 107S and the layer 107L may act as efficient etch stop material. Thus, the contact opening 123 may be formed within the material 122 and may extend down to and into the etch stop material 121, as is also previously explained.

Figure 1H:
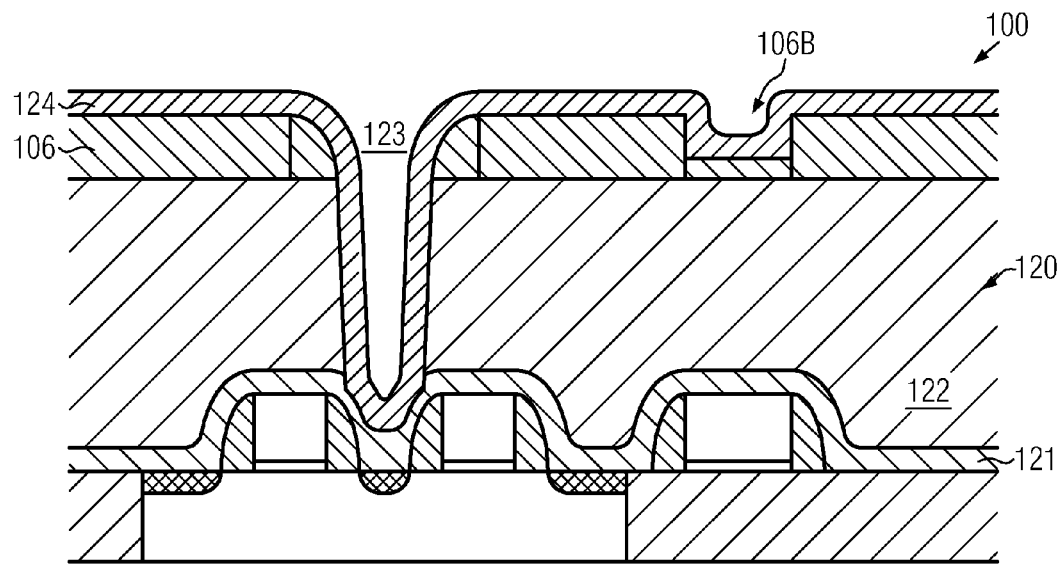

FIG. 1*h* schematically illustrates the device 100 wherein the liner material 124 may be formed above the etch mask 106 and within the contact opening 123. As previously indicated, the liner material 124 may be provided in the form of any appropriate dielectric material, such as silicon dioxide, and with a thickness that is appropriately selected so as to reduce the lateral dimensions of the contact opening 123. Moreover, as illustrated, the liner 124 may also be formed within the mask opening 106B.

Figure 1I:
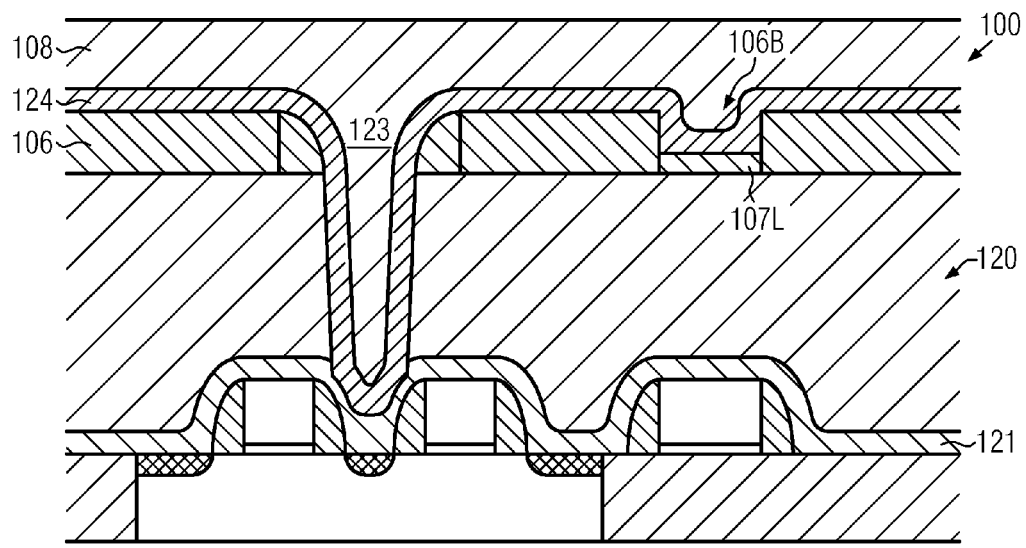

FIG. 1*i* schematically illustrates the device 100 with a sacrificial fill material 108 formed above the liner material 124, thereby also filling the contact opening 123 and the mask opening 106B. The sacrificial fill material 108 may be provided in the form of any appropriate polymer material, which may be applied in a state of low viscosity, thereby reliably filling the contact opening 123 and also providing a substantially planar surface topography.

Figure 1J:
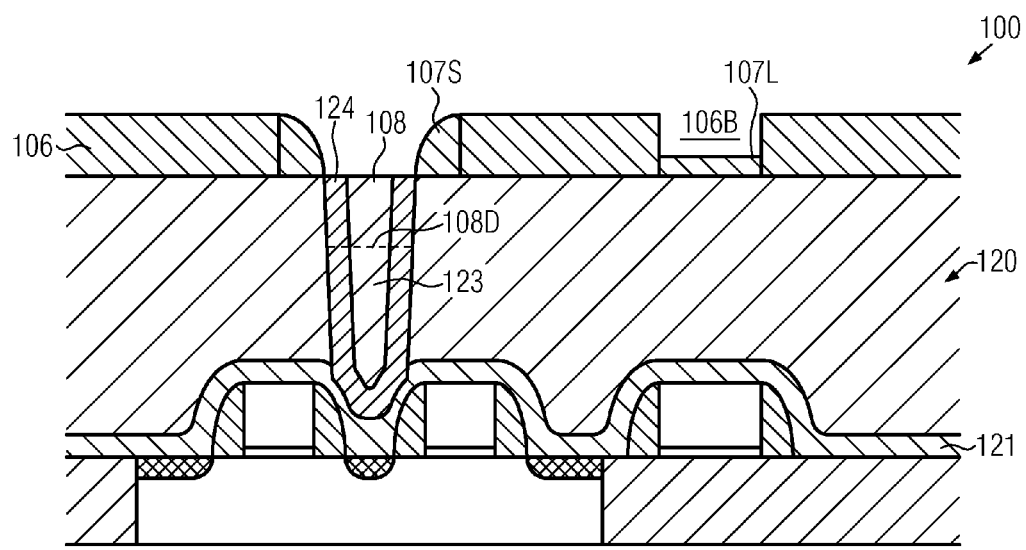

FIG. 1*j* schematically illustrates the semiconductor device 100 in a further advanced manufacturing stage. As illustrated, the sacrificial material 108 may be etched back to a certain degree, for instance so as to expose the liner 124 (FIG. 1*i*), which may subsequently be etched on the basis of any appropriate anisotropic etch technique. During the corresponding etch process, a portion of the sacrificial fill material 108 may be consumed, wherein, depending on the degree of over etch required for completely removing the material of the liner 124 from the mask opening 106B, a certain degree of recessing, as indicated by 108D, may be created in the contact opening 123. It should be appreciated, however, that at least a significant portion of the liner 124 may be preserved within the contact opening 123. Consequently, the spacer layer 107L may be exposed within the mask opening 106B. Thereafter, the layer 107L may be removed, for instance, by any appropriate anisotropic etch technique, wherein a certain portion of the mask 106 may also be removed, wherein, however, the mask opening 106B may be preserved and may be used in a subsequent etch process. In other cases, the spacers 107S and the spacer layer 107L may be comprised of a material which may be etched selectively with respect to the material of the mask 106, thereby substantially avoiding any material removal of the mask 106. For example, the spacer 107S and the layer 107L may be provided in the form of a carbon material, which may be efficiently etched on the basis of an oxygen plasma and the like. It should be appreciated that, in some illustrative embodiments, prior to removing the spacer layer 107L, an additional sacrificial fill material may be applied and may be appropriately etched back so as to replace any portion of the materials 124 and 108, which may have been removed during the previous processing, as is, for instance, indicated by 108D, when superior integrity of the remaining portions of the materials 124 and 108 in the contact opening, i.e., below the dashed line 108D, is considered appropriate. It should be appreciated that a corresponding additional fill material may also be provided in the mask opening 106B which, however, may be efficiently etched back prior to removing the layer 107L.

Figure 1K:
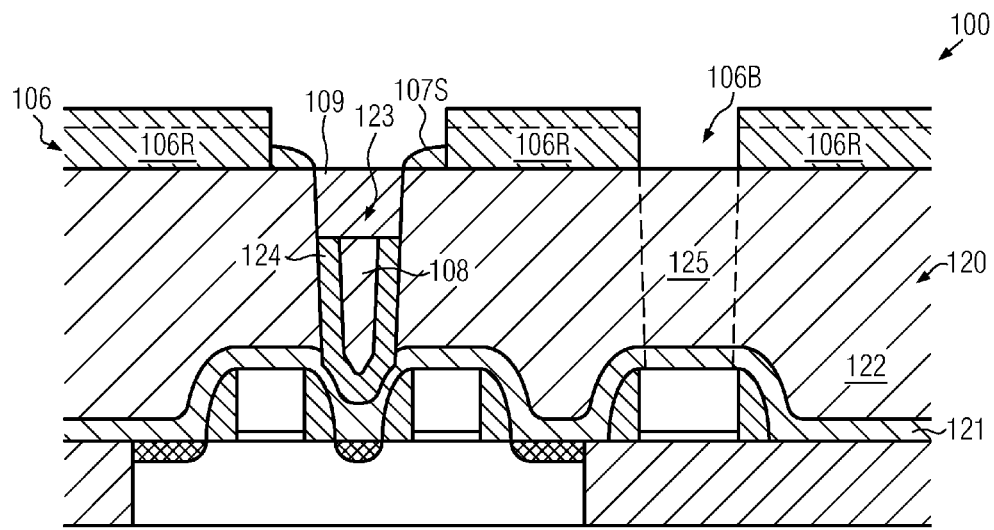

FIG. 1*k* schematically illustrates the semiconductor device 100 after the above-described process sequence. As illustrated, the mask opening 106B may be "reopened," for instance, by performing an anisotropic etch process, thereby possibly also reducing the thickness of the mask 106, as indicated by 106R. Since the initial thickness of the mask 106 may be appropriately selected, the remaining portion 106R may nevertheless be used as an efficient hard mask material in order to reliably define the lateral position and size of the contact opening 125 during a subsequent anisotropic etch process. In the contact opening 123, on the other hand, the liner 124 may be covered by a sacrificial fill material 109, which may be provided for sufficient etch resistivity when forming the contact opening 125 in the dielectric material 122. To this end, the sacrificial material 109 may be provided in the form of a polymer material, a resist material and the like. The thickness of the sacrificial material 109 may be efficiently adjusted on the basis of the degree of recessing created during the previous processing, as is, for instance, illustrated in FIG. 1*j* by the dashed line 108D. After forming the contact opening 125, the further processing may be continued by removing the sacrificial materials 109, 108, which may be accomplished on the basis of any oxygen plasma assisted etch recipes, wet chemical etch recipes and the like. Thereafter, a further anisotropic etch process may be performed so as to form an opening in the liner material 124, thereby exposing the etch stop material 121 within the contact opening 123.

Figure 1L:
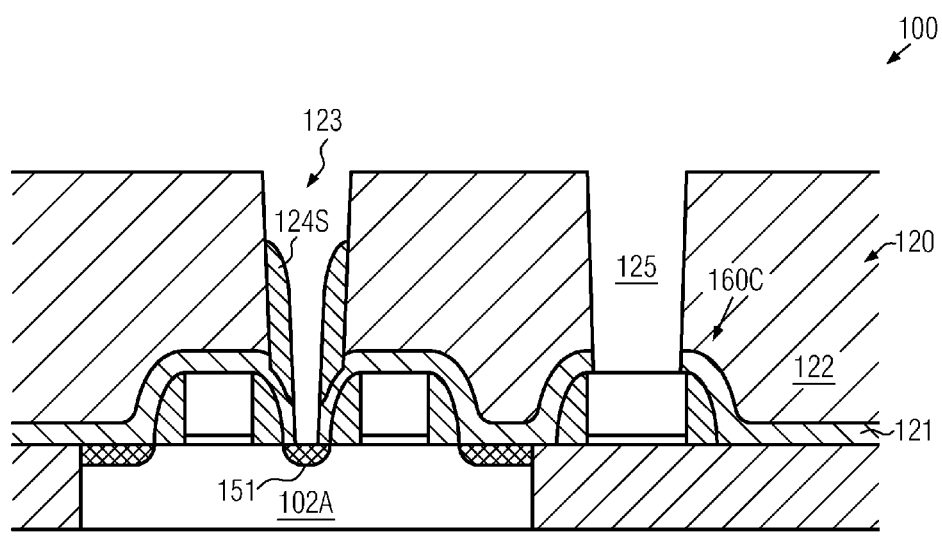

FIG. 1*l* schematically illustrates the semiconductor device 100 in a further advanced manufacturing stage. As illustrated, spacers 124S may be formed within the contact opening 123 and may thus define a desired lateral dimension of the contact opening 123 in a lower portion thereof, as is also previously explained. Moreover, the contact opening 123 may extend to and into the contact region 151, while the contact opening 125 may extend to the gate electrode structure 160C. To this end, established anisotropic etch techniques may be applied to etch through the etch stop layer 121 after forming the sidewall spacer 124S, wherein also the mask 106 (FIG. 1*k*) may be removed if comprised of silicon nitride. Thereafter, the further processing may be continued by filling in any appropriate contact materials, as is also previously described. Consequently, the contact openings 123, 125 may be provided with superior reliability with respect to the contact opening 123 and with a desired lateral dimension for the contact element 125, wherein corresponding first portions of these contact elements may be formed on the basis of a sequential patterning regime, as is also previously discussed, wherein, however, a single lithography process may be sufficient so as to define the lateral size and position of these contact openings on the basis of a hard mask material.

As a result, the present disclosure provides semiconductor devices and manufacturing techniques in which a contact opening extending to the active semiconductor region in a densely packed device region may be provided with reduced lateral dimensions, at least at a lower portion thereof, by using a liner material prior to forming contact elements extending to less critical device areas, such as gate electrode structures, for which a reduction in lateral size would result in an undue increase of the contact resistivity. Consequently, the probability of creating short circuits between closely spaced gate electrode structures and contact elements connecting to the active semiconductor region may be reduced, while at the same time superior contact resistivity may be obtained for other contact elements, such as contact elements connecting to gate electrode structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming contact elements of a semiconductor device, the method comprising:
    forming a first contact opening in an interlayer dielectric material;
    forming a liner on sidewalls of said first contact opening so as to reduce a width of said first contact opening;
    forming a second contact opening in said interlayer dielectric material after forming said liner;
    increasing a depth of said first and second contact openings so as to connect to a first and second contact region, respectively; and
    filling said first and second contact openings with a conductive material so as to form a first contact element connecting to said first contact region and a second contact element connecting to said second contact region.

2. The method of claim 1, wherein said first contact region is formed in a semiconductor region and is positioned between two adjacent gate electrode structures.

3. The method of claim 1, wherein said second contact region is formed in a gate electrode structure.

4. The method of claim 1, wherein forming said second contact opening comprises forming said second contact opening through said liner.

5. The method of claim 1, wherein forming said second contact opening comprises removing said liner from above said interlayer dielectric material prior to performing an etch process to etch into said interlayer dielectric material.

6. The method of claim 1, wherein forming said first and second contact openings comprises providing a hard mask having a first mask opening with a first width and a second mask opening with a second width, and using said first mask opening for forming said first contact opening and said second mask opening for forming said second contact opening.

7. The method of claim 6, wherein said first width is greater than said second width.

8. The method of claim 7, wherein forming said first and second contact openings further comprises forming an etch stop spacer in said first mask opening, forming an etch stop layer in said second mask opening and forming said first contact opening through said first mask opening having said etch stop spacer while said second mask opening is masked by said etch stop layer.

9. A method of forming contact elements of a semiconductor device, the method comprising:
   forming a first portion of a first contact opening in a dielectric material of a contact level of said semiconductor device;
   forming a liner selectively in said first portion of said first contact opening so as to reduce a width thereof;
   after forming said liner, forming a first portion of a second contact opening in said dielectric material;
   after forming said first portion of said second contact opening, performing a common etch process to form respective second portions of said first and second contact openings; and
   filling said first and second contact openings with a conductive material.

10. The method of claim 9, wherein said first contact opening connects to a semiconductor region of a semiconductor layer and said second contact opening connects to a gate electrode structure formed above said semiconductor layer.

11. The method of claim 9, wherein forming said first and second contact openings comprises providing a hard mask that includes a first mask opening and a second mask opening, wherein said first mask opening has a greater width than said second mask opening.

12. The method of claim 11, further comprising forming a spacer layer in said first and second mask openings, wherein said spacer layer overfills said second mask opening.

13. The method of claim 12, wherein forming said first portion of said first contact opening comprises using said first mask opening and a spacer formed from said spacer layer, while masking said second mask opening using said spacer layer.

14. The method of claim 13, wherein said liner is formed in said first portion of said first contact opening through said mask opening, wherein said method further comprises removing said liner from above said dielectric material and from within said second mask opening, removing said spacer layer in said second mask opening and forming said first portion of said second contact opening while masking said first portion of said first contact opening by a sacrificial fill material.

15. The method of claim 9, wherein forming said first portion of said first contact opening comprises forming a first mask layer having a first mask opening above said dielectric material and using said first mask opening to form said first portion of said first contact opening.

16. The method of claim 15, wherein forming said liner selectively in said first portion of said first opening comprises removing said first mask layer and forming said liner above said dielectric material.

17. The method of claim 15, wherein forming said first portion of said second contact opening comprises forming a second mask layer having a second mask opening above said dielectric material and using said second mask opening to form said first portion of said second contact opening.

18. The method of claim 17, wherein said second mask layer is formed above said liner and fills said first portion of said first contact opening.

* * * * *